(12) United States Patent
Hsu et al.

(10) Patent No.: US 7,843,281 B2
(45) Date of Patent: Nov. 30, 2010

(54) CIRCUIT TOPOLOGY FOR MULTIPLE LOADS

(75) Inventors: Shou-Kuo Hsu, Taipei Hsien (TW); Chia-Nan Pai, Taipei Hsien (TW); Hsiao-Chuan Tu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 212 days.

(21) Appl. No.: 11/838,238

(22) Filed: Aug. 14, 2007

(65) Prior Publication Data
US 2008/0116994 A1 May 22, 2008

(30) Foreign Application Priority Data
Nov. 17, 2006 (CN) .................... 2006 1 0156894

(51) Int. Cl.
*H03H 7/38* (2006.01)

(52) U.S. Cl. .................... 333/130; 333/32; 333/33

(58) Field of Classification Search ............ 333/130, 333/32, 33
See application file for complete search history.

(56) References Cited

U.S. PATENT DOCUMENTS

| | | | | |
|---|---|---|---|---|
| 3,904,990 A | * | 9/1975 | La Rosa | 333/128 |
| 4,356,462 A | * | 10/1982 | Bowman | 333/128 |
| 4,460,877 A | * | 7/1984 | Sterns | 333/26 |
| 4,556,856 A | * | 12/1985 | Presser | 333/124 |
| 5,126,704 A | * | 6/1992 | Dittmer et al. | 333/125 |
| 5,134,664 A | | 7/1992 | Clough et al. | |
| 5,828,273 A | * | 10/1998 | Harrison | 333/127 |
| 6,489,859 B1 | * | 12/2002 | Tahara et al. | 333/128 |
| 6,600,384 B2 | * | 7/2003 | Mohwinkel et al. | 333/22 R |
| 6,922,169 B2 | * | 7/2005 | Moh'd Izzat et al. | 342/360 |
| 7,199,681 B2 | * | 4/2007 | Amirtharajah et al. | 333/130 |
| 2005/0289632 A1 | * | 12/2005 | Brooks et al. | 725/126 |

* cited by examiner

*Primary Examiner*—Robert Pascal
*Assistant Examiner*—Kimberly E Glenn
(74) *Attorney, Agent, or Firm*—Frank R. Niranjan

(57) ABSTRACT

A circuit topology for multiple loads is provided. In an embodiment, the circuit topology includes a driving terminal (50), a first node (A), a first receiving terminal (10), and a second receiving terminal (20). The driving terminal is coupled to the first node via a main transmission line (11), the first node is respectively coupled to the first and second receiving terminals via a first branch transmission line (13) and a second branch transmission line (12). A first resistor (R2) is mounted on the second branch transmission line, a distance the signal travels from the driving terminal to the second receiving terminal via the main transmission line and the second branch transmission line is greater than a distance the signal travels from the driving terminal to the first receiving terminal via the main transmission and the first branch transmission line.

5 Claims, 4 Drawing Sheets

CIRCUIT TOPOLOGY FOR MULTIPLE LOADS

BACKGROUND

1. Field of the Invention

The present invention relates to a circuit topology, and particularly to a circuit topology for multiple loads on a mother board.

2. Description of Related Art

Signal integrity is an important factor to be taken into account when a printed circuit board (PCB) is designed. A well-designed PCB has an elevated on-off switching speed of integrated circuits, and a high density, compact layout of components. Parameters of the components and of the PCB substrate, a layout of the components on the PCB, and a layout of high-speed signal transmission lines all have an impact on signal integrity. In turn, proper signal integrity helps the PCB and an associated computer system to achieve stable performance. Layout of the components is considered as an important part of signal integrity, sometimes signals that reflect back and forth along transmission line cause what is called "ringing."

Referring to FIG. 3, a conventional circuit topology coupling a signal transmitting terminal to three signal receiving terminals is shown. A signal transmitting terminal 100 is coupled to three signal receiving terminals 60, 70, 80 via corresponding transmission lines. The distance a signal travels from the signal transmitting terminal 100 to the signal receiving terminal 80 is greater than a distance the signal travels from the signal transmitting terminal 100 to the signal receiving terminals 60, 70. A resistor Rs is set on the transmission line close to the signal transmitting terminal 100 to eliminate signal reflections. Referring to FIG. 4, a graph illustrating signal waveforms 66, 77, 88 respectively obtained at receiving terminals 60, 70, 80 using the circuit topology of FIG. 3 is shown. Signals arriving at the receiving terminal 80 reflect back and forth along the transmission line causing "ringing" at receiving terminals 60, 70.

What is needed, therefore, is a circuit topology which can eliminate the signal reflections and maintain signal integrity.

SUMMARY

An exemplary circuit topology includes a driving terminal, a first node, a second node, a first receiving terminal, a second receiving terminal, and a third receiving terminal. The driving terminal is coupled to the first node via a main transmission line, the first node is respectively coupled to the second node and the first receiving terminal via a first branch transmission line and a second branch transmission line. The second node is respectively coupled to the second receiving terminal and the third receiving terminal via a third branch transmission line and a fourth branch transmission line. A first resistor and a second resistor are respectively mounted on the fourth and first branch transmission lines, a distance the signal travels from the driving terminal to the third receiving terminal is greater than a distance the signal travels from the driving terminal to the first and second receiving terminals.

Other objects, advantages and novel features of the present invention will become more apparent from the following detailed description of preferred embodiments when taken in conjunction with the accompanying drawings, in which:

DETAILED DESCRIPTION

Figure 1:
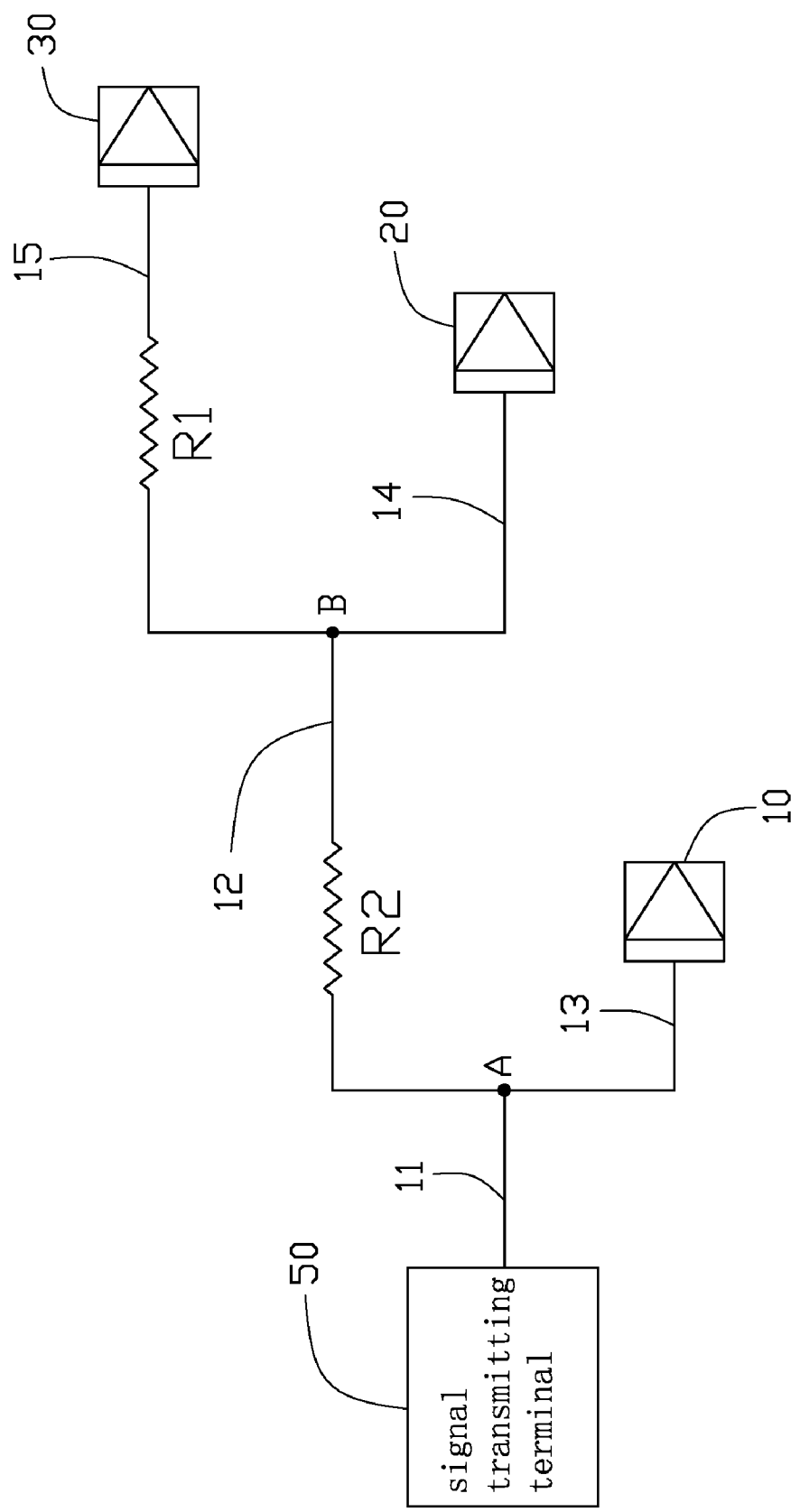
FIG. 1 is a block diagram of a circuit topology, in accordance with an embodiment of the present invention.

Referring to FIG. 1, a circuit topology in accordance with an embodiment of the present invention is shown. A signal transmitting terminal 50 functioning as a driving terminal is coupled to a first node A via a main transmission line 11, the first node A is coupled to a second node B and a first signal receiving terminal 10 respectively via a first branch transmission line 12 and a second branch transmission line 13. The second node B is coupled to a second signal receiving terminal 20 and a third signal receiving terminal 30 respectively via a third branch transmission line 14 and a fourth branch transmission line 15. A first resistor R1 and a second resistor R2 respectively mounted on the fourth and first branch transmission lines 15 and 12, a distance the signal travels from the signal transmitting terminal 50 to the third signal receiving terminal 30 is greater than a distance the signal travels from the signal transmitting terminal 50 to the first and second signal receiving terminals 10 and 20. Resistances of the first and second resistors R1, R2 should match impedance of the transmission lines, in this embodiment, resistances of the first and second resistors R1, R2 are respectively 56 ohm and 22 ohm.

Figure 2:
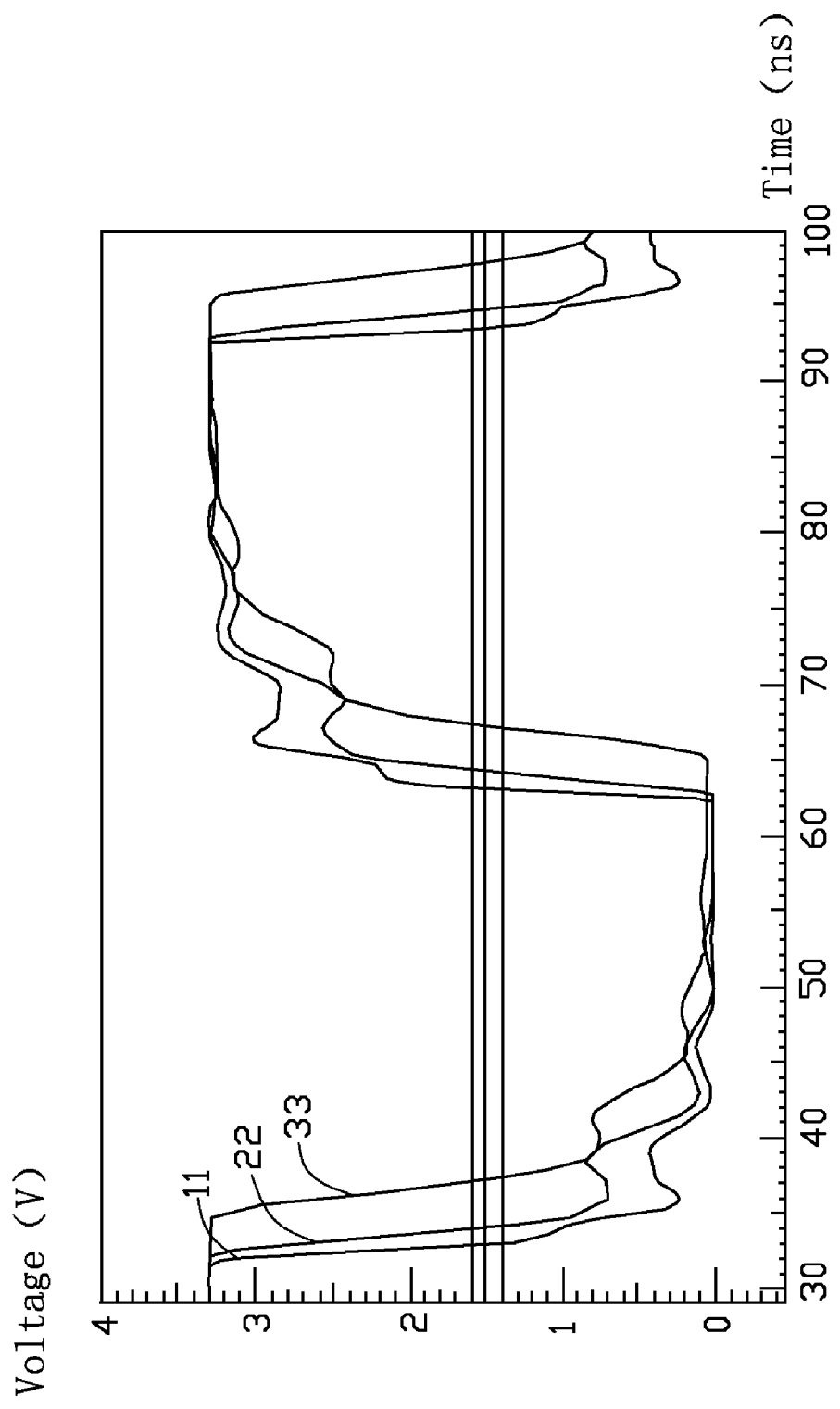
FIG. 2 is a comparative graph showing signal waveforms obtained at each signal receiving terminal using the circuit topology of FIG. 1.
Figure 3:
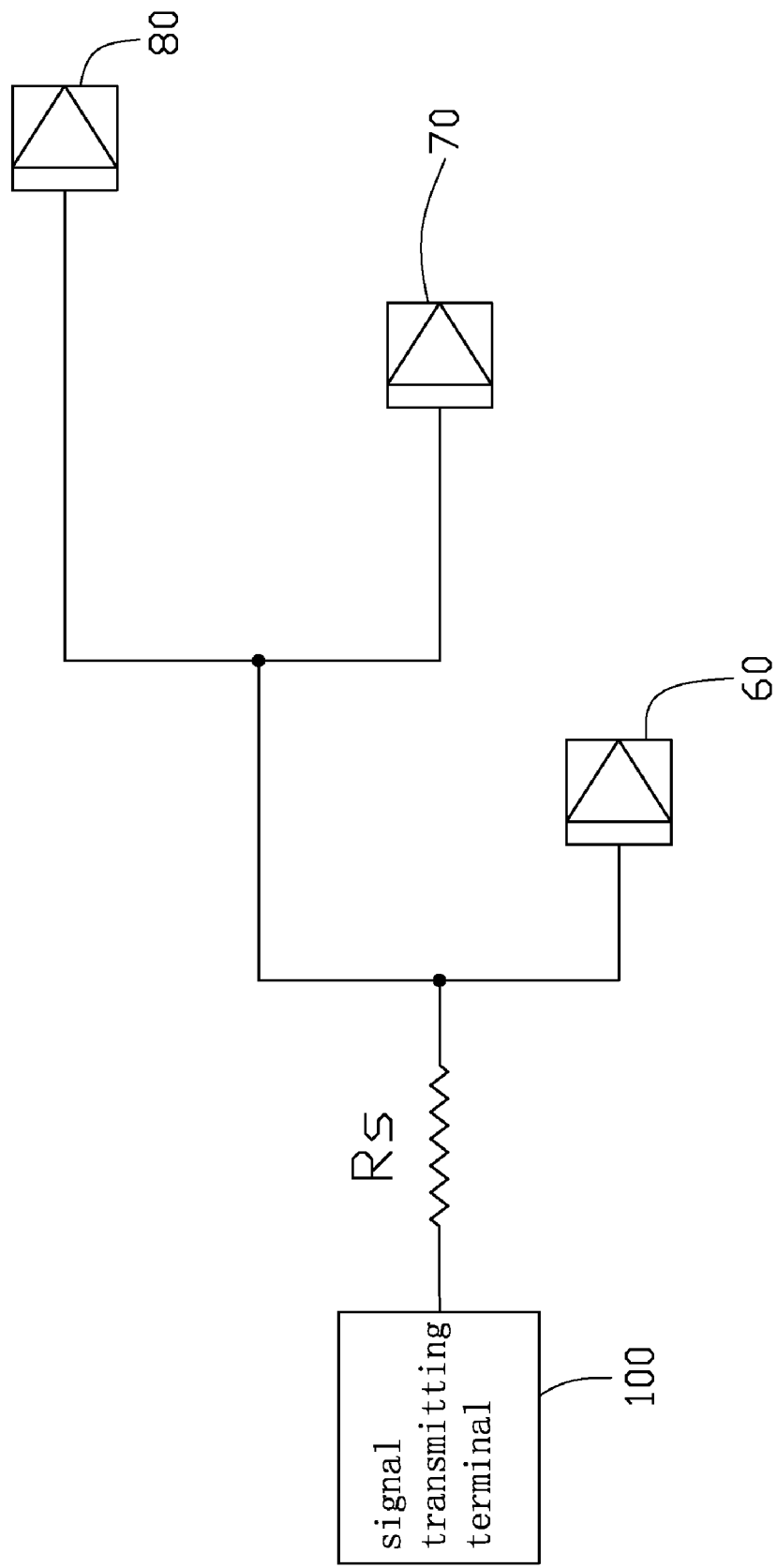
FIG. 3 is a block diagram of a conventional circuit topology coupling a signal transmitting terminal to three signal receiving terminals.
Figure 4:
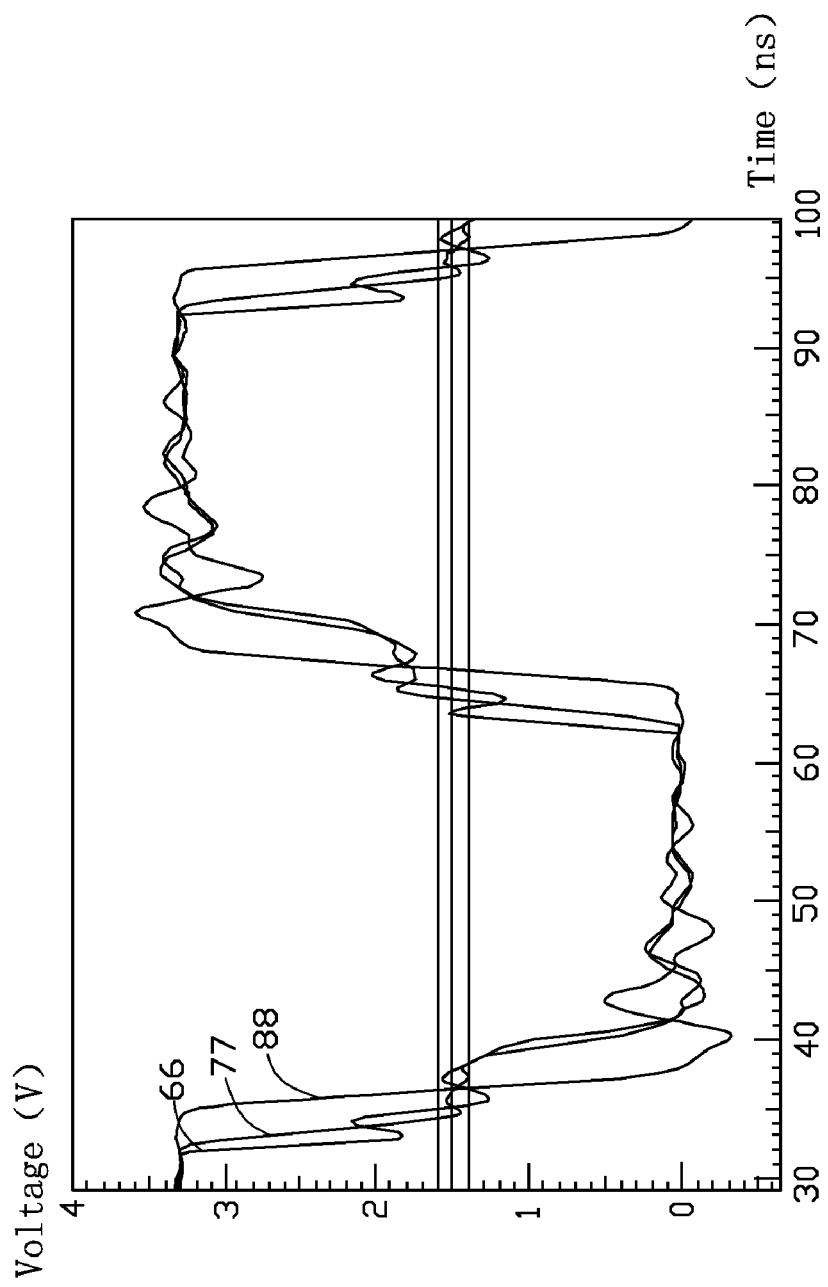
FIG. 4 is a comparative graph showing signal waveforms obtained at each signal receiving terminal using the circuit topology of FIG. 3.

When the signal transmitting terminal 50 sends signals to the signal receiving terminals 10, 20, 30, the resistor R1 weakens the signals transmitted to the third signal receiving terminal 30 and enhances the signals arriving at the second signal receiving terminal 20, therefore signal reflections from the third signal receiving terminal 30 are reduced, and signal integrity at the first and second signal receiving terminals 10 and 20 is improved. The resistor R2 further reduces signal reflections from the second and third signal receiving terminals 20 and 30, and signal integrity at the first signal receiving terminal 10 is further improved. FIG. 2 is a graph showing signal waveforms obtained at each signal receiving terminals 10, 20, using the circuit topology of FIG. 1, signal waveforms 11, 22, 33 are corresponding to signal receiving terminals 10, 20, 30. Compared with FIG. 4, it can be seen that signal reflections are reduced and signal integrity is maintained.

In the above-described circuit topology of the embodiment of the present invention, the signal transmitting terminal 50, and the signal receiving terminals 10, 20, 30 are used as examples. In other embodiments, the circuit topology with a resistor connected to the receiving terminal to which a signal travels a greater distance may be used for any other multiple loads on a PCB.

The foregoing description of the exemplary embodiment of the invention has been presented only for the purposes of illustration and description and is not intended to be exhaustive or to limit the invention to the precise forms disclosed. Many modifications and variations are possible in light of the above teaching. The embodiment was chosen and described in order to explain the principles of the invention and its practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A circuit topology comprising:
   a driving terminal;
   a first node coupled to the driving terminal via a main transmission line;
   a second node coupled to the first node via a first branch transmission line;
   a first signal receiving terminal coupled to the first node via a second branch transmission line;
   a second signal receiving terminal coupled to the second node via a third branch transmission line;
   a third signal receiving terminal coupled to the second node via a fourth branch transmission line, wherein a distance a signal travels from the driving terminal to the third signal receiving terminal is greater than a distance the signal travels from the driving terminal to the first and second signal receiving terminals; and
   wherein a first resistor is connected between two opposite terminals of the fourth branch transmission line, and wherein the first resistor reduces signal reflections from the third signal receiving terminal.

2. The circuit topology as claimed in claim 1, further comprising a second resistor connected to the first branch transmission line between the first node and second nodes, wherein the second resistor reduces signal reflections from the second and third signal receiving terminals.

3. The circuit topology as claimed in claim 1, wherein the first resistor is 56 ohm.

4. The circuit topology as claimed in claim 2, wherein the second resistor is 22 ohm.

5. A circuit topology comprising:
   a signal transmitting terminal for transmitting a signal;
   a first node coupled to the signal transmitting terminal via a main transmission line;
   a first signal receiving terminal coupled to the first node via a first branch transmission line;
   a second signal receiving terminal coupled to the first node via a second branch transmission line, wherein a distance the signal travels from the signal transmitting terminal to the second signal receiving terminal via the main transmission line and the second branch transmission line is greater than a distance the signal travels from the signal transmitting terminal to the first signal receiving terminal via the main transmission line and the first branch transmission line; and
   a third signal receiving terminal with a third branch transmission line coupled to the second branch transmission line via a second node, wherein the second signal receiving terminal is coupled to the second node via a fourth branch transmission line, a distance the signal travels from the second node to the third signal receiving terminal is greater than a distance the signal travels from the second node to the second signal receiving terminal;
   wherein a first resistor is connected to the second branch transmission line between the first and second nodes, the first resistor reduces signal reflections from the second and third signal receiving terminals, and wherein a second resistor is connected between two opposite terminals of the third branch transmission line, and the second resistor reduces signal reflections from the third signal receiving terminal.

* * * * *